United States Patent
An

(10) Patent No.: US 7,223,702 B2
(45) Date of Patent: May 29, 2007

(54) METHOD OF AND APPARATUS FOR PERFORMING SEQUENTIAL PROCESSES REQUIRING DIFFERENT AMOUNTS OF TIME IN THE MANUFACTURING OF SEMICONDUCTOR DEVICES

(75) Inventor: Jae-Hyuck An, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 153 days.

(21) Appl. No.: 11/034,950

(22) Filed: Jan. 14, 2005

(65) Prior Publication Data

US 2005/0136591 A1 Jun. 23, 2005

Related U.S. Application Data

(62) Division of application No. 10/265,699, filed on Oct. 8, 2002, now Pat. No. 6,911,112.

(30) Foreign Application Priority Data

Nov. 29, 2001 (KR) ............................ 2001-0075019

(51) Int. Cl.
*H01L 21/302* (2006.01)
(52) U.S. Cl. .................. 438/716; 438/715; 156/345.31; 156/345.32
(58) Field of Classification Search ................ 438/706, 438/715, 716; 156/345.24, 345.31, 345.32
See application file for complete search history.

(56) References Cited

U.S. PATENT DOCUMENTS 4,951,601 A  8/1990  Maydan et al.
5,217,501 A * 6/1993 Fuse et al. .................. 29/25.01
5,464,313 A  11/1995  Ohsawa
5,820,366 A  10/1998  Lee
5,855,675 A  1/1999  Doering et al.
5,906,866 A * 5/1999 Webb .......................... 427/534
5,961,323 A  10/1999  Lee
6,007,675 A * 12/1999 Toshima ................. 156/345.32
6,352,594 B2  3/2002  Cook et al.
2002/0099470 A1  7/2002  Zinger et al.

FOREIGN PATENT DOCUMENTS

JP    4-188721    7/1992
JP   11-329988   11/1999
JP   2000-21798   1/2000

\* cited by examiner

*Primary Examiner*—Lan Vinh
(74) *Attorney, Agent, or Firm*—Volentine & Whitt, PLLC

(57) ABSTRACT

A method of manufacturing a semiconductor device includes first and second processes, the latter requiring more processing time. An apparatus for performing the semiconductor manufacturing process includes a first reactor, and a plurality of second reactors for each first reactor. A first group of wafers are subjected to the first process within the first reactor, and are then transferred into a second reactor as isolated from the outside air. The first group of wafers is subjected to the second process within the second reactor. At the same time, a second group of wafers are subjected to the first process within the first reactor. After the first process is completed, the second group of wafers is transferred into an unoccupied one of the second reactors as isolated from the outside air. There, the second group of wafers is subjected to the second process. Accordingly, process failures otherwise due to the exposure of the wafers are minimized, and productivity is high despite the difference in the processing times.

22 Claims, 6 Drawing Sheets

METHOD OF AND APPARATUS FOR PERFORMING SEQUENTIAL PROCESSES REQUIRING DIFFERENT AMOUNTS OF TIME IN THE MANUFACTURING OF SEMICONDUCTOR DEVICES

CROSS-REFERENCE TO RELATED APPLICATIONS

This is a divisional of U.S. application Ser. No. 10/265,699, filed Oct. 8, 2002, and now U.S. Pat. No. 6,911,112.

BACKGROUND OF THE INVENTION

1. Field of the Invention

The present invention relates to a method of and apparatus for manufacturing semiconductor devices. More particularly, the present invention relates to a method of and apparatus for forming a film on a plurality of wafers.

2. Description of the Related Art

Generally, semiconductor devices are manufactured by repeatedly performing a series of processes, such as photolithography, etching, ion implantation, chemical and mechanical polishing and the like, on a wafer. The respective conditions under which these processes are performed must be optimized such that the semiconductor devices manufactured by the unit processes have enhanced functions and a minimal rate of failure. In addition, the time periods under which the respective processes are carried out should be optimized so as to enhance the productivity of the overall semiconductor device manufacturing process.

The respective unit processes have been gradually improved in consideration of these goals. However, productivity still lags in many areas of the manufacturing process and the respective unit processes are still prone to failures having a certain root cause.

For instance, the respective unit processes for manufacturing the semiconductor devices includes a batch type chemical vapor deposition process used to form respective films on a plurality of wafers at the same time. The batch type chemical vapor deposition process is carried out in a furnace maintained at a high temperature. Thus, a native oxide is frequently formed by the reaction of silicon at the upper surface of the wafer and oxygen. In other words, an undesired native oxide is grown on the surface of the wafer before the actual CVD process begins. Accordingly, a film is formed on the native oxide and not on the surface of the wafer, whereby a process failure will occur.

FIG. 1 is a sectional view of a semiconductor device in which a native oxide has been formed on the surface of the wafer. As shown in the figure, an oxide film 12 is formed on a silicon substrate 10. A contact hole is then formed to expose a portion of the silicon substrate 10 in which a source or drain is formed, for example. Subsequently, a conductive film 16 is formed by chemical vapor deposition on the oxide film 12 to fill the contact hole and contact the exposed portion of the substrate 10.

However, as mentioned above, before the conductive film 16 can be formed, a native oxide 14 having a thickness of a few Å to a few hundred Å is formed on the surface exposed by the contact hole. This native oxide 14 is an insulating material formed between the underlying silicon substrate 10 and the conductive film 16. Accordingly, contact resistance increases. This increase in the contact resistance results in a corresponding decrease in the operation speed of the semiconductor device and otherwise degrades the electrical properties and reliability of the device.

Accordingly, the native oxide and organic foreign particles are removed prior to the chemical vapor deposition process. This removal of native oxide and organic foreign particles is generally carried out by a wet etch process in which the wafers are dipped in an etch solution in a separate wet etch apparatus. In other words, the native oxide is removed from surfaces of the wafers using chemicals, the chemicals are cleaned from the surfaces of the wafers, and the wafers are dried. Afterwards, the wafers are transferred into the furnace whereupon the chemical vapor deposition process is performed.

In the method described above, even after the native oxide is removed, the silicon component of the wafer surface may again react with oxygen such that a new native oxide is grown on the surface of the wafer. To prevent this from occurring, the deposition process must be performed within a certain time after the native oxide has been first removed from the surface of the wafer. Otherwise, the new native oxide must be removed from the surface of the wafer.

However, the mass production of semiconductor devices makes it very difficult to perform the deposition process directly after the wet etch process. Also, incorporating the wet etch process into the overall manufacturing process reduces the manufacturing rate because the wet etch process equipment and the deposition process equipment are separately operated.

Moreover, a native oxide cannot be completely prevented from re-growing on the surface of the wafer even when the deposition process is performed within the time period called for, by the process recipe, after the native oxide is removed. A native oxide grows rapidly on the surface of the wafer while the wafer is loaded into the furnace because the reaction between oxygen and silicon occurs more actively occurs at the high temperature maintained in the furnace. Thus, it is very difficult to use wet etching to prevent a native oxide from residing on the surface of the wafer before the CVD process is initiated.

Japanese Patent Laid Open Publication No. 4-188722 discloses a heat treatment apparatus aimed at removing the native oxide from a surface of a wafer and preventing the native oxide from re-growing on the surface. The heat treatment apparatus includes a furnace in which a film is deposited on a wafer, a dry etching chamber disposed to one side of the furnace, a loadlock chamber connecting the dry etch apparatus to the furnace, and a robot arm for loading or unloading the wafer into and from the furnace. In this apparatus, the deposition process is carried out after the native oxide is removed by dry etching and the wafer is loaded into the furnace via the loadlock chamber.

However, this process requires a great deal of time because the apparatus uses a robot arm to transfer the wafers from the loadlock chamber. More specifically, the wafers are transferred by the robot arm into a boat in the dry etching chamber. The robot arm can transfer only a few sheets (approximately five sheets) of wafers at a time. Thus, the transfer operation must be performed a numbers of times to transfer the total number of sheets of wafers (25 sheets to one hundred sheets) of one batch. Once the dry etching is completed, the wafers disposed in the boat within the etching chamber are again transferred, this time to a boat within the furnace. After the deposition process is completed, the wafers are unloaded from a boat within the furnace and are transferred out of the furnace using the robot arm.

SUMMARY OF THE INVENTION

An object of the present invention is to solve the above-described problems of the prior art.

That is, one object of the present invention is to provide a method of manufacturing a semiconductor device that includes first and second processes requiring different processing times and yet is both highly productive and highly efficient. Likewise, an object of the present invention is to provide an apparatus capable of performing the semiconductor manufacturing process without producing devices prone to process failures and without the need for significant downtime.

The apparatus of the present invention includes a first batch reactor in which the first process is performed, and at least two second reactors in which the second process requiring more time than the first process is performed. A loadlock chamber communicates with inlets of the first and second reactors so as to define a path along which the group of wafers can be transferred therebetween. The loadlock chamber is sealed from the outside air. A transfer module is provided in the loadlock chamber for transferring the wafers.

The first reactor may comprises a dry etching module, whereas the second reactors may comprise furnaces of a chemical vapor deposition system.

In the method of the present invention, a first group of wafers is transferred into the first reactor whereupon the first process, e.g., dry etching, is performed. Once the first process has been completed, the first group of wafers is transferred into one of the second reactors while in a state isolated from external air. The second process which requires more time than the first process, e.g., chemical vapor deposition, is performed on the first group of wafers within the second reactor, and at the same time a second group of wafers is transferred into the first reactor. Then, the first process is performed on the second group of wafers within the first reactor. Subsequently, the second group of wafers is transferred into one of the second reactors, that does not already contain a batch wafers, while the second group of wafers is isolated from the external air. There, the second process is performed on the second group of wafers during the same period of time that the second process is being completed on the first group of wafers. Once the second process is completed, the wafers are unloaded from the second reactors. The steps can be repeated with respect to the wafers.

BRIEF DESCRIPTION OF THE DRAWINGS

The above and other objects, features and advantages of the present invention will become more apparent from the following detailed description of the preferred embodiments thereof made with reference to the attached drawings, of which.

DETAILED DESCRIPTION OF THE PREFERRED EMBODIMENTS

Figure 1:
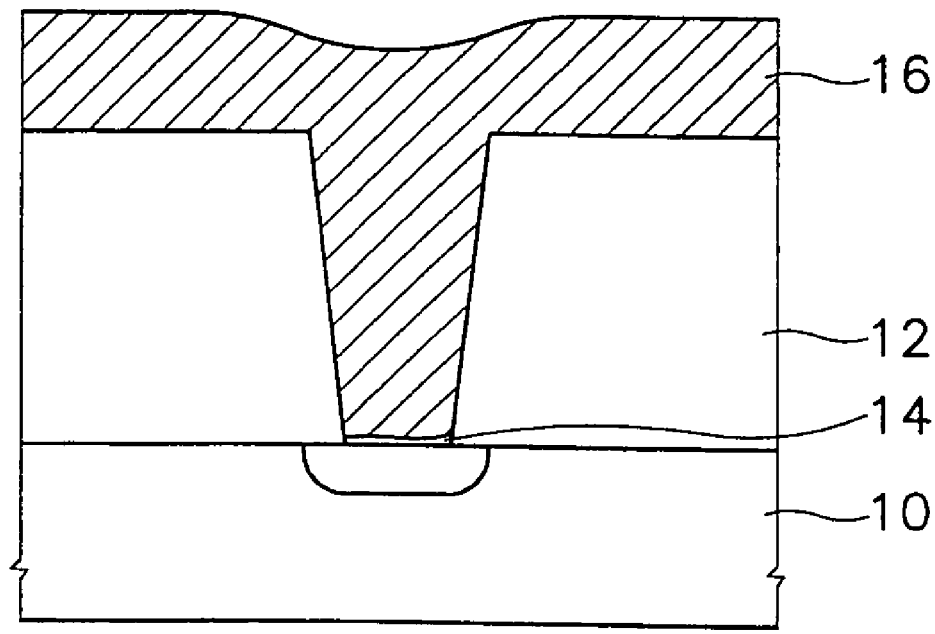
FIG. 1 is a sectional view of a semiconductor wafer on which a native oxide film has grown.
Figure 2:
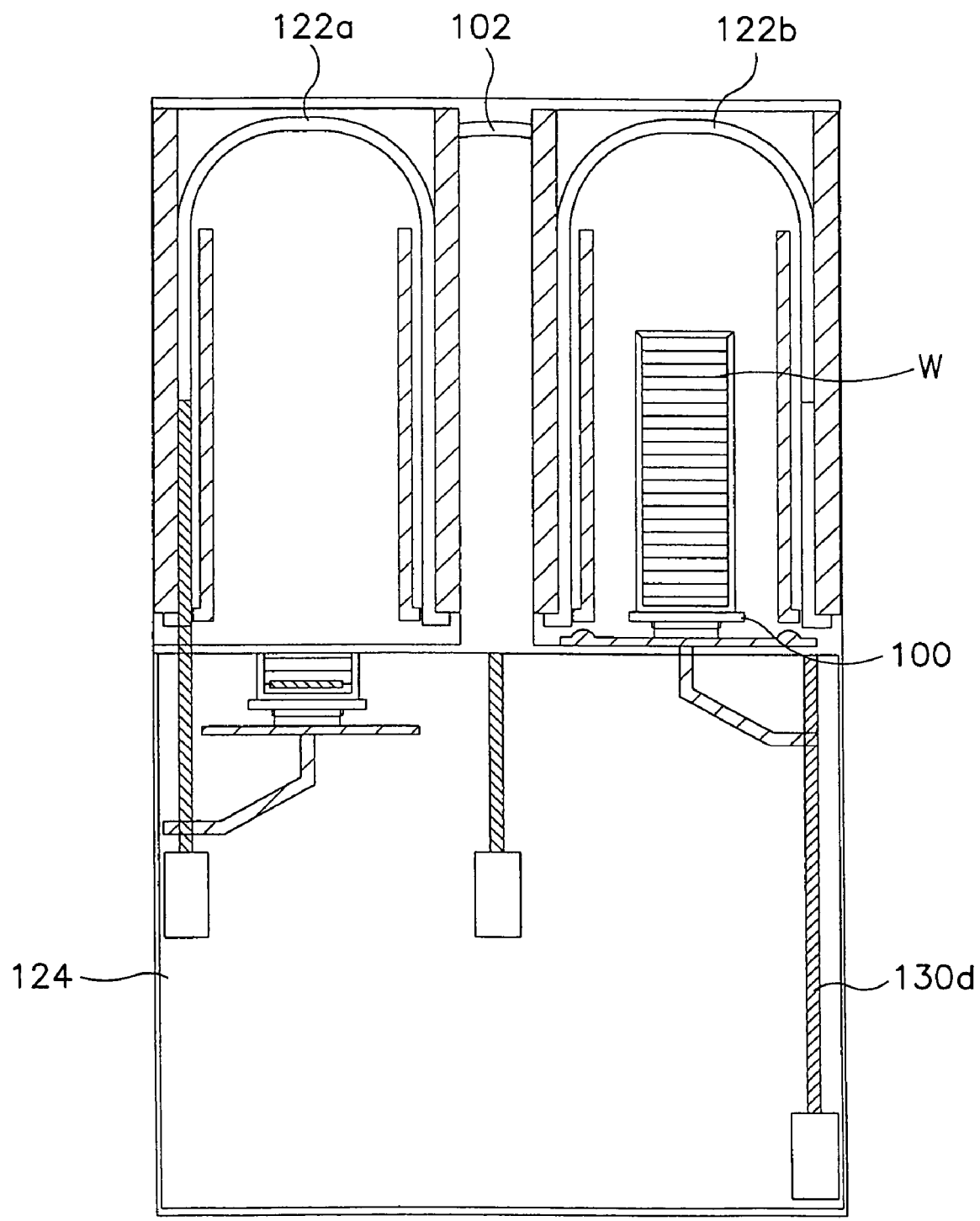
FIG. 2 is a schematic longitudinal sectional view of a semiconductor processing apparatus according to the present invention.
Figure 3:
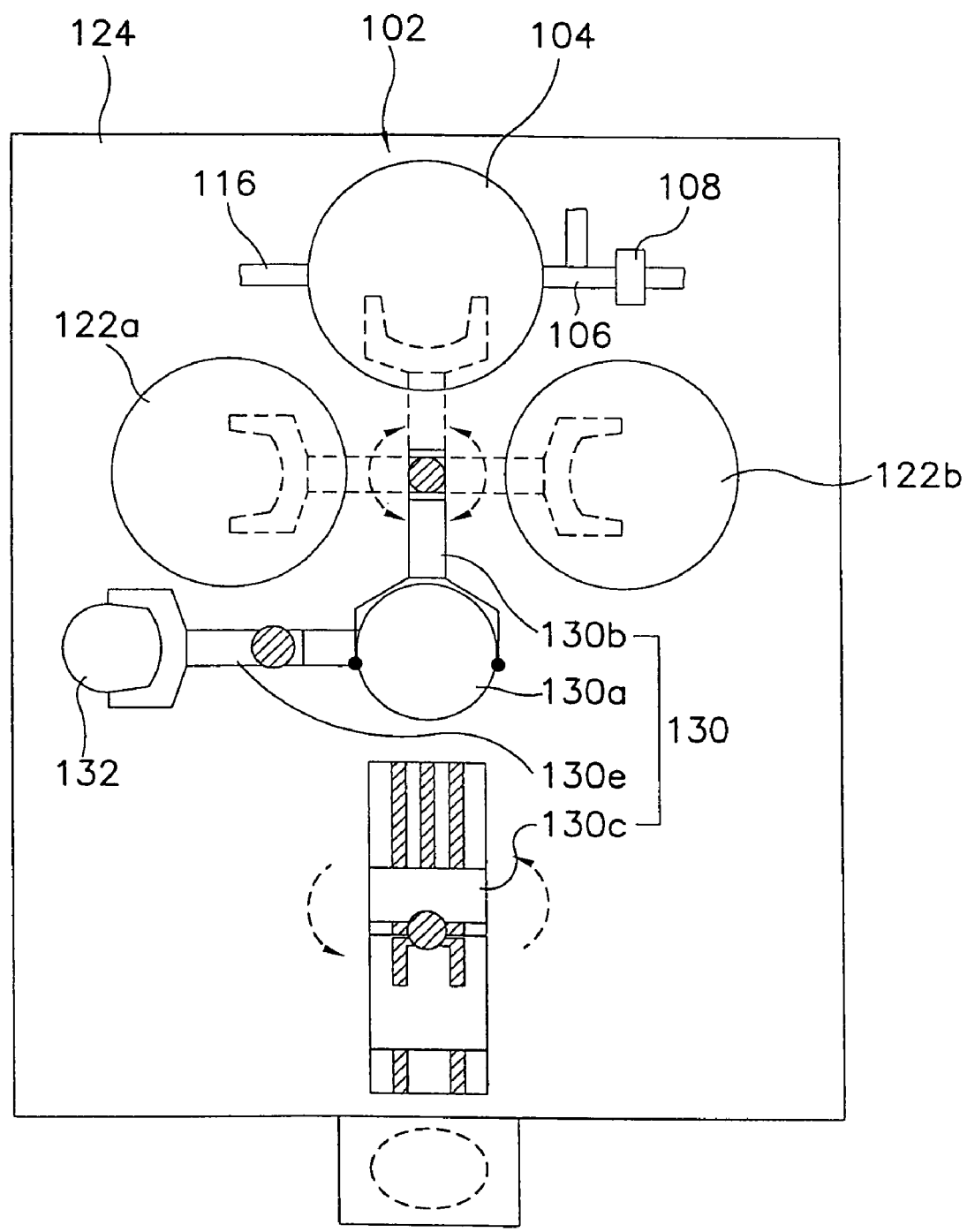
FIG. 3 is a schematic plan view of the semiconductor processing apparatus according to the present invention.
Figure 4:
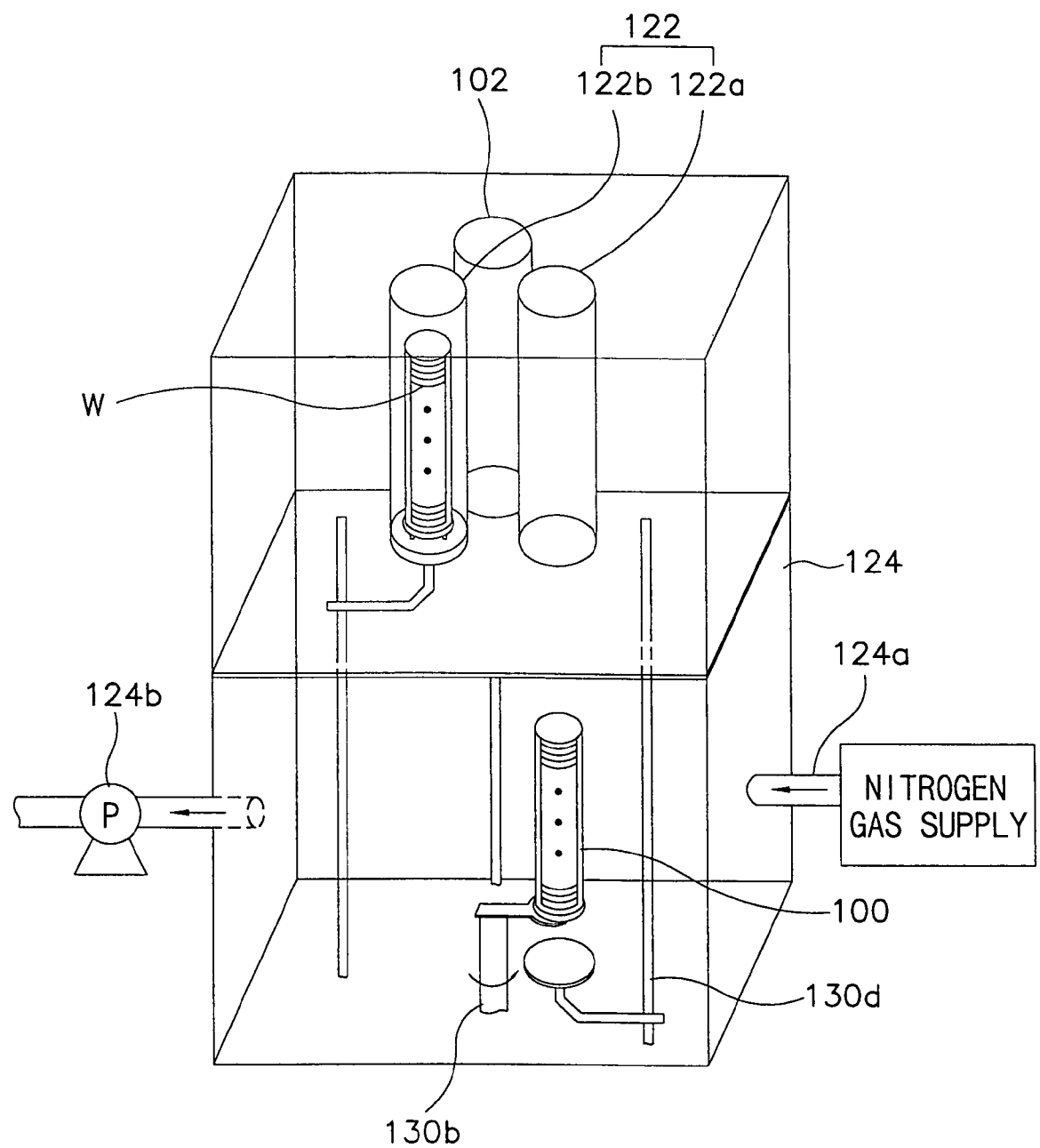
FIG. 4 is a schematic perspective view of the semiconductor processing apparatus according to the present invention.
Figure 5:
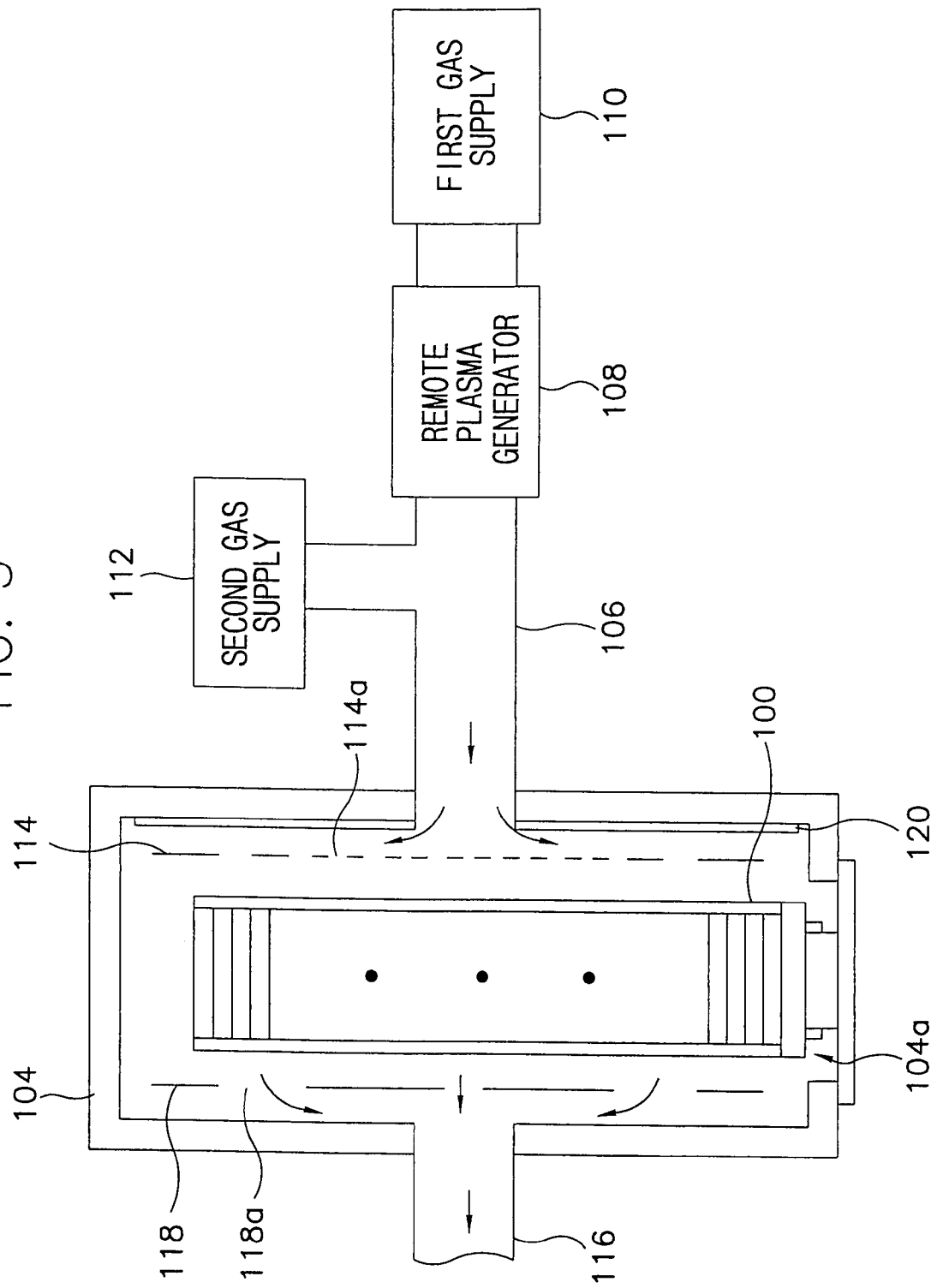
FIG. 5 is a sectional view of a dry etch module of the apparatus.

The preferred embodiments of the present invention will hereinafter be described in detail with reference to accompanying drawings.

First, the semiconductor processing apparatus according to the present invention will be described with reference to FIGS. 2 to 5.

The semiconductor processing apparatus includes a boat 100 for receiving a plurality of sheets of wafers. The boat 100 can receive 25 sheets to 100 sheets of wafers, constituting one process group or batch of wafers. The apparatus also includes a dry etch module 102 for performing a dry etch process on a batch of wafers. The dry etch module 102 removes native oxide from the surfaces of the wafers. The dry etch module 102 will now be described in detail with reference to FIG. 5.

The dry etch module 102 comprises an etching chamber 104 having a volume capable of receiving the boat 100 on which the plurality of sheets of wafers are mounted. An inlet through which the boat 100 is introduced into the chamber 104 is disposed at a lower portion of the etching chamber 104. An etch gas supply line 106 is connected to the etching chamber 104 for supplying an etch gas into the etching chamber 104. A remote plasma generator 108 is connected with the etch gas supply line 106. The remote plasma generator is a device that is well-known, per se, for exciting the etch gas that is introduced into the etching chamber 104 of the dry etch module.

A first gas supply 110 is connected with the remote plasma generator 108, and supplies the etch gas into the etching chamber 104 via the remote plasma generator 108. A second gas supply 112 is connected to a line branched from the etch gas supply line 106 between the etching chamber 104 and the remote plasma generator 108. Accordingly, gas supplied from the second etch gas supply 112 is supplied to the etching chamber 104 without passing the remote plasma generator 108.

A first distributing plate 114 having a plurality of holes 114a is disposed within the etching chamber 104. The first distributing plate 114 is interposed between the side of the etching chamber 104 into which the etch gas supply line 106 enters and the region in the chamber dedicated to receive the boat 100. Accordingly, the etch gas from the etch gas supply line 106 is supplied into the etching chamber 104 through the plurality of holes 114a formed in the distributing plate 114. The sizes of the holes 144a in the first distributing plate 114 vary such that the etch gas is uniformly supplied into the region in the chamber dedicated to receive the boat 100. Specifically, the holes in a first portion of the plate adjacent the location (outlet port) at which the etch gas supply line 106 opens into the chamber 104 are preferably smaller than those holes in a second portion of the plate that is remote (located further) from the outlet port of the etch gas supply line 106.

An exhaust system 116 is connected to the etching chamber 104 for exhausting etch gas that is supplied into the etching chamber but does not react with the wafers.

A second distributing plate 118 having a plurality of holes 118a is disposed in the chamber 104. The second distributing plate 118 is interposed between the side of the etching chamber 104 into which the exhaust system 116 opens and the region dedicated to receive the boat 100 in the etching chamber 104. Accordingly, the non-reacted gas is exhausted to the exhaust system 116 through the plurality of holes 118*a* in the second distributing plate 118. The sizes of the holes 118*a* in the second distributing plate 118 vary such that the non-reacted etch gas will be uniformly exhausted from the etch chamber 104. That is, the holes 118*a* in a first portion of the plate adjacent to the exhaust system 116 are smaller than the holes that are in a second portion of the plate remote (located further) from the location (port) at which the exhaust system 116 opens into the chamber 104.

A temperature control device 120 for elevating or lowering the temperature of the wafers mounted in the boat 100 is disposed along the inner side portion of the etching chamber 104. The wafers are preferably maintained at a temperature within a range of from about 15 ° C. to 30 ° C. while the native oxide is etched from the surfaces of the wafers. By-products are generated at the surfaces of the wafers as a result of the dry etch process. The wafers must be heat-treated to detach and thus to remove these by-products from the surfaces of the wafers. Accordingly, the temperature control device 120 elevates the temperature within the etching chamber 104 after the etching process is performed.

Next, the remainder of the semiconductor processing apparatus will be described with reference, again, to FIGS. 2-4.

The semiconductor processing apparatus includes a plurality of furnaces 122 each having a volume sufficient to receive the boat 100, and each for forming films on a plurality of wafers mounted on the boat 100. The furnaces 122 each have an inlet, though which the boat 100 is introduced, at a lower portion of the furnace 122.

The batch type of chemical vapor deposition process that is carried out in each of the furnaces 122 generally requires a process time that is two to three times greater than the time required to carry out the process of removing native oxide in the dry etch module 102. Thus, the number of furnaces 122 depends on the time required to carry out the etch process. Specifically, the number of the furnaces 122 is such that a ratio of the etch process time to the deposition process time is equal to or less than a ratio of one etch module to the number of furnaces. The present embodiment comprises two furnaces 122, namely a first furnace 122*a* and a second furnace 122*b*. Also, the number of boats 100 depends on the number of the furnaces 122. In particular, the number of boats 100 is equal to or greater than the number of the furnaces 122, so that the chemical vapor deposition processes can be simultaneously carried out in the furnaces 122.

The semiconductor process apparatus also includes a loadlock chamber 124 communicating with the inlet of each of the furnaces 122 and the inlet of the dry etch module 102. The loadlock chamber 124 is sealed from the outer environment.

A nitrogen gas supply part 124*a* is connected to one side of the loadlock chamber 124 for supplying nitrogen gas into the chamber. An exhaust pump 124*b* is also connected to the loadlock chamber 124 for exhausting gas from the loadlock chamber 124. Nitrogen gas is continuously supplied into the loadlock chamber 124 by the nitrogen gas supply part 124*a* while the gas within the loadlock chamber 124 is partially exhausted, such the loadlock chamber 124 is filled only with the nitrogen gas after a certain period of time. Although gas flows from the loadlock chamber 124, the small flow of gas hardly influences the process, and yet the loadlock chamber 124 is easy to maintain. Alternatively, a vacuum pump may be connected to one side of the loadlock chamber 124. The vacuum pump maintains a vacuum inside the loadlock chamber 124 to thereby prevent air from residing in the loadlock chamber.

A transfer module 130 is disposed within the loadlock chamber 124. The transfer module 130 functions to mount one group of wafers on the boat 100 and transfer the wafer-laden boat 100 into the dry etch module 102 and the furnaces 122*a*, 122*b*. To this end, the transfer module 130 includes a boat standby support 130*a* on which the boat containing a plurality of wafers stands by. Also, the transfer module 130 includes a wafer transfer device 130*c* for mounting several sheets of wafers into the boat 100 at the boat standby support 130*a*. The wafer transfer device 130*c* is controlled to load the wafers, that are to be processed, into the boat 100, and to unload the wafers, that have undergone the deposition process, from the boat 100. The wafer transfer device 130*c* can transfer about five sheets of wafers into the boat 100 once.

Still further, the transfer module 130 includes a first boat changer 130*b* for transferring the wafer-laden boat 100 from the boat standby support 130*a* to a position adjacent the inlet of the dry etch module 102 or the inlet of one of the furnaces 122. The first boat changer 130*b* horizontally is capable of being rotated in a horizontal plane and is capable of being translated forward and backward while the boat 100 is disposed on an upper surface thereof. The first boat changer 130*b* is controlled to first transfer the boat 100 from the standby support 130*a* to a position adjacent the inlet of the dry etch module 102. After the wafers in the boat 100 are etched in the dry etch module 102, the first boat changer 130*b* moves from a position adjacent the inlet of the dry etch module 102 to a position adjacent the inlet of one of the furnaces 122. Accordingly, the dry etch module 102 and the furnaces 122 are arranged to minimize the path along which the boat 100 is to be moved by the first boat changer 130*b*.

Thus when there are two furnaces 122 as in the present embodiment, the dry etch module 102 is arranged between the first furnace 122*a* and the second furnace 122*b* so as to minimize the path along which the boat 100 must be moved during each transfer operation. Also, each of the furnaces 122 and the dry etch module 102 are preferably spaced from each other by a distance no greater than the rotational radius of the first boat changer 130*b* such that the above-mentioned transfer operation can be carried out simply by rotationally driving the first boat changer 130*b*.

The transfer module 130 also includes a boat elevator 130*d* operable to raise and lower the boat 100. The boat elevator 130*d* is controlled to raise a boat 100 that has been transferred to a location adjacent the inlet of a furnace 122 or the inlet 104*a* of the dry etch module 102 by the first boat changer 130*b*, and to thereby load the boat 100 into the dry etch module 102 or the furnace 122. In this embodiment, a respective boat elevator 130*d* is provided for each of the dry etch module 102 and the furnaces 122, whereby boat elevators 130*d* load the boat into the dry etch module 102 and the furnaces 122, respectively.

A cooling station 132 (FIG. 3) is disposed within the loadlock chamber 124 for reducing the temperature of the boat 100 on which the wafers are mounted. A second boat changer 130*e* is disposed between the cooling station 132 and the boat standby support 130*a* for transferring the boat 100 from the boat standby support 130*a* to the cooling station 132.

Accordingly, the boat 100 containing wafers which have undergone the deposition process may be transferred by the second boat changer 130*e* from the boat standby support 130*a* to the cooling station 132. Then, the temperature of the wafers, and the temperature of the boat 100 containing the wafers are lowered in the cooling station 132. Subsequently, the boat 100 is transferred to the boat standby support 130a by the second boat changer 130e. Finally, the wafers are transferred to the outside of the loadlock chamber 124 by the wafer transfer device 130c.

As described above, the semiconductor device processing apparatus is furnished with multiple furnaces 122 for each dry etch module 102 in consideration of the fact that the deposition process requires more time than the etch process. Accordingly, there is no down-time and thus, the semiconductor manufacturing process is performed with a high degree of productivity. Also, the re-growing of the native oxide is prevented because the deposition process is performed directly after the native oxide removing process without having exposed the wafer to the outside air.

Figure 6:
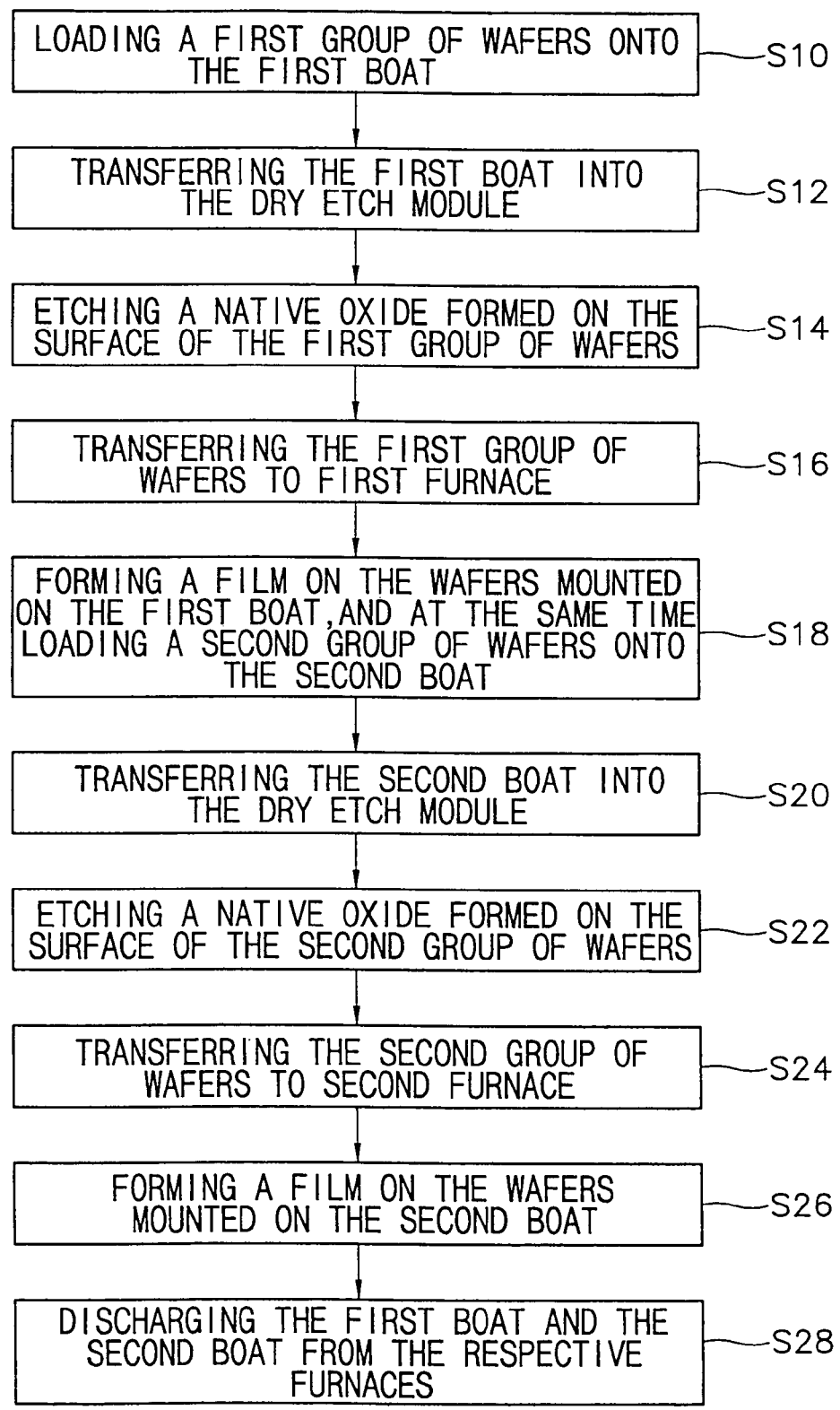
FIG. 6 is a process flow chart illustrating a method of processing a semiconductor wafer in according to the present invention.

Next, the semiconductor device manufacturing process will be described in specific detail with reference to the flow chart of FIG. 6.

A first group of wafers is loaded onto the first boat (step S10). The first boat can accommodate 25 to 100 sheets of wafers. Specifically, the first boat while empty is placed in a standby position on the boat standby support 130a. Then, the wafer transfer device 130c transfers multiple sheets of wafers onto the first boat. The wafer transfer device 130c can transfer about five sheets of wafers at a time and so, the transfer operation is repeated, if necessary, until a desired number of wafers are loaded.

The first boat is then transferred into the dry etch module 102 (step S12). Specifically, the first boat is transferred by the first boat changer 130b from the standby position to a position adjacent the inlet 104a of the dry etch module 102. The first boat is then raised by the boat elevator 130d into the etching chamber 104.

Then, the first group of wafers is dry-etched in the dry etch module 102 to remove native oxide from the surfaces of the wafers (step S14). Initially, the temperature of the etching chamber 104 is maintained at a temperature of about 15-30° C. In this state, an etch gas is supplied into the etching chamber 104. The etch gas includes a reaction gas comprising a fluorine-containing compound capable of etching oxides with ease, and a carrier gas for carrying the reaction gas. The carrier gas dissociates the fluorine atoms from the reaction gas to form fluorine radicals in order to perform the etch process. For example, $NF_3$ can be used as the reaction gas, and excited nitrogen gas, excited hydrogen gas or a mixture thereof can be used as the carrier gas. The fluorine radicals are bonded (reacted) with the silicon of the native oxide ($SiO_2$) formed on the wafer to form an etch product such as SiF.

Subsequently, the temperature in the etching chamber 104 and thus, the surface temperature of the first group of wafers, is raised until the etch product attached to the surface of the wafers is vaporized. In particular, the temperature of the etching chamber 104 is raised to about 150-300° C., whereupon the etch product is vaporized, and the vaporized etch product is exhausted to the outside of the etching chamber 104.

Once the native oxide formed on the surfaces of the first group of wafers is removed, the first boat is transferred to the first furnace 122a (step S16). The path along which the boat is transferred from the dry etch module 102 to the first furnace 122a is filled with nitrogen gas, or is maintained in a vacuum, to isolate the wafers loaded on the boat from outside air containing oxygen.

Specifically, the first boat is lowered through the inlet 104a of the dry etch module by the boat elevator 130d and thus is transferred to the outside of the dry etch module 102. Subsequently, the first boat is transferred by the first boat changer 130b to a position adjacent the inlet of the first furnace 122a. The transferred first boat is raised by the boat elevator 130d into the first furnace 122a.

Next, a chemical vapor deposition process is carried out in the first furnace 122a to form a film on the wafers mounted in the first boat. At the same time, a second group of wafers is loaded into the second boat (step S18). The method of loading the second group of wafers into the second boat is identical to that of loading the first group of wafers into the first boat. Accordingly, a detailed description thereof will be omitted.

The second boat is then transferred into the dry etch module 102 (step S20). To this end, the second boat is first transferred to a position adjacent the inlet 104a of the dry etch module 102 by the first boat changer 130b. The second boat is then raised into the dry etch module 102 by the boat elevator 130d associated with the dry etch module 102. Native oxide formed on the surfaces of the second group of wafers is dry-etched in the dry etch module 102 (step S22).

Once the native oxide formed on the surfaces of the wafers has been removed, the second boat is transferred to one of the furnaces 122 that does not already contain a wafer boat, i.e., the second furnace 122b. In this case, as well, the second boat is transferred from the dry etch module 102 to the furnace 122b while the wafers on the second boat remain isolated from the outside air (step S24).

A chemical vapor deposition process is then carried in the second furnace 122b to form a film on the wafers mounted on the second boat (step S26).

Again, the chemical vapor deposition process requires two or three times the amount of time as the preceding native oxide removing process because the native oxide formed on the surfaces of the wafers is relatively thin. In particular, the native oxide is only a few Å or a few hundred Å. Therefore, the series of processes (steps S20 to S26) from the process of removing the native oxide from the second group of wafers and the chemical vapor deposition process of forming a film on the wafers can be performed while the chemical vapor deposition process is performed with respect to the first group of wafers.

Once the chemical vapor deposition process is completed on both groups of wafers, the boats on which the wafers are loaded are discharged from the respective furnaces 122 (step S28). In particular, the first boat containing wafers on which the processes are first completed is discharged from the first furnace 122a, and then the second boat is discharged from the second furnace 122b.

Next, a cooling process may be performed to lower the temperature of the boats discharged from the furnaces 122 and the temperature of the wafers loaded in the boats. The cooling process is performed in the separate cooling station 132 that is furnished outside the furnaces 122. To this end, a boat is transferred from the furnace 122 in which the deposition process has been performed to the boat standby support 130a, and the boat is then transferred form the boat standby part 130a to the cooling station 132 by the second boat changer 130e. Once the cooling process is completed, the boat is again transferred to the boat standby support 130a and the cooled wafers are transferred from the boat to the outside of the loadlock chamber 104 by the wafer transfer device 130c.

According to the semiconductor device processing method described above, the etch process (a preceding process) and the deposition process (the subsequent process) can be performed without delay. Accordingly, the processing method has a high degree of productivity. Also, a re-growing of the native oxide can be minimized because the deposition process is performed without the wafer having been exposed to outside air after the native oxide has been first removed form the wafer. Accordingly, when the deposition process forms a conductive film over a contact hole that exposes a surface of the wafer that was subjected to the etch process, minimal contact resistance occurs. The result is a semiconductor device having enhanced characteristics and reliability.

Although the present invention has been described in detail with reference to the preferred embodiments thereof, various changes, substitutions and alterations thereto will be apparent to those skilled in the art that. All such changes, substitutions and alterations are seen to be within the true spirit and scope of the invention as defined by the appended claims.

What is claimed is:

1. A method of performing a semiconductor manufacturing process, the method comprising:
   i) transferring a first group of wafers into a first reactor;
   ii) performing a first process on the first group of wafers within the first reactor;
   iii) after the first process has been completed in the first reactor, transferring the first group of wafers into a first one of a plurality of second reactors while the first group of wafers is isolated from air outside the first and second reactors;
   iv) performing a second process, requiring a process time longer than that required by the first process, on the first group of wafers within the first one of the second reactors, and at the same time transferring a second group of wafers into the first reactor;
   v) performing the first process on the second group of wafers within the first reactor;
   vi) transferring the second group of wafers, that have undergone the first process, into a second one of the second reactors that is not occupied by wafers while the second group of wafers is isolated from air outside the first and second reactors;
   vii) performing the second process on the second group of wafers within the second one of the second reactors while the first group of wafers are undergoing the second process in the first one of the second reactors; and
   viii) unloading the groups of wafers, that have undergone the second process, from the second reactors.

2. The method as claimed in claim 1, wherein the transferring of the first and second groups of wafers into the respective second reactors is carried out while the wafers are enveloped in nitrogen gas.

3. The method as claimed in claim 1, wherein the transferring of the first and second groups of wafers into the respective second reactors is carried out while the wafers are in a vacuum.

4. The method as claimed in claim 1, wherein the transferring of the first and second groups of wafers into the first reactor comprises loading the first group of wafers onto a first boat and the second group of wafers onto a second boat, respectively.

5. The method as claimed in claim 4, wherein the transferring of the first and second groups of wafers into the first reactor comprises transferring the first and second boats onto which the first and second groups of wafers have been loaded to a standby position adjacent the first reactor.

6. The method as claimed in claim 1, wherein the second process is a chemical vapor deposition process.

7. The method as claimed in claim 6, and further comprising cooling the wafers after the wafers have undergone the chemical vapor deposition process.

8. The method as claimed in claim 1, wherein the first process is a dry etch process.

9. The method as claimed in claim 8, wherein the dry etch process is an etch process for removing a native oxide film from a surface of the wafers.

10. The method as claimed in claim 8, wherein the dry etch process comprises
    i) supplying a reaction gas comprising a fluorine-containing compound, and an excited carrier gas into an etching chamber to form a reaction product with a native oxide film formed on the wafers; and
    ii) separating the reaction product from the wafers.

11. The method as claimed in claim 10, wherein the supplying of the gases into the etching chamber is performed at a temperature ranging from about 15° to 30° C.

12. The method as claimed in claim 10, wherein the separating of the reaction product comprises maintaining a temperature of about 15° C. to 30° C. in the etching chamber.

13. A method of performing a semiconductor manufacturing process, the method comprising:
    i) transferring wafers into a first batch reactor such that all of the wafers reside in the first batch reactor together as a first group;
    ii) performing a first process simultaneously on the wafers of the first group within the first batch reactor;
    iii) after the first process has been completed in the first batch reactor, transferring the wafers of the first group into a first one of a plurality of second batch reactors while the wafers of the first group are isolated from air outside the first and second reactors and such that the wafers of the first group reside together in the first one of the second batch reactors;
    iv) performing a second process, requiring a process time longer than that required by the first process, simultaneously on the wafers of the first group within the first one of the second batch reactors, and at the same time transferring wafers into the first batch reactor such that wafers reside in the first batch reactor together as a second group;
    v) performing the first process simultaneously on the wafers of the second group within the first batch reactor;
    vi) transferring the wafers of the second group, that have undergone the first process, into a second one of the second batch reactors that is not occupied by wafers while the wafers of the second group are isolated from air outside the first and second batch reactors and such that the wafers of the second group reside together in the second one of the second batch reactors;
    vii) performing the second process simultaneously on the wafers of the second group within the second one of the second batch reactors while the first group of wafers are undergoing the second process in the first one of the second batch reactors; and
    viii) unloading the groups of wafers, that have undergone the second process, from the second reactors.

14. The method as claimed in claim 13, wherein the transferring of the wafers into the respective second batch reactors is carried out while the wafers are enveloped in nitrogen gas.

15. The method as claimed in claim 13, wherein the first process is a dry etch process.

16. The method as claimed in claim 13, wherein the second process is a chemical vapor deposition process.

17. The method as claimed in claim 13, wherein the transferring of the wafers of the first and second groups into the first batch reactor comprises loading several wafers onto a first boat and loading several wafers onto a second boat, respectively.

18. The method as claimed in claim 17, wherein the transferring of the wafers into the first batch reactor comprises transferring the first and second boats onto each of which several wafers have been loaded to a standby position adjacent the first batch reactor.

19. The method as claimed in claim 13, wherein the transferring of the wafers into the respective second batch reactors is carried out while the wafers are in a vacuum.

20. The method as claimed in claim 19, wherein the dry etch process is an etch process for removing a native oxide film from a surface of the wafers.

21. The method as claimed in claim 19, wherein the dry etch process comprises i) supplying a reaction gas comprising a fluorine-containing compound, and an excited carder gas into an etching chamber to form a reaction product with a native oxide film formed on the wafers; and ii) separating the reaction product from the wafers.

22. The method as claimed in claim 21, and further comprising cooling the wafers after the wafers have undergone the chemical vapor deposition process.

* * * * *